US006310376B1

(12) United States Patent
Ueda et al.

(10) Patent No.: US 6,310,376 B1
(45) Date of Patent: Oct. 30, 2001

(54) SEMICONDUCTOR STORAGE DEVICE CAPABLE OF IMPROVING CONTROLLABILITY OF DENSITY AND SIZE OF FLOATING GATE

(75) Inventors: Tohru Ueda; Kenta Nakamura, both of Fukuyama; Yasumori Fukushima, Sakurai, all of (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/165,800

(22) Filed: Oct. 2, 1998

(30) Foreign Application Priority Data

Oct. 3, 1997 (JP) .................................................. 9-271436

(51) Int. Cl.[7] .................................................. H01L 29/788
(52) U.S. Cl. .......................................... 257/315; 257/412
(58) Field of Search .................................... 257/315, 316, 257/412, 401

(56) References Cited

U.S. PATENT DOCUMENTS

| | | | |
|---|---|---|---|
| 5,508,543 | 4/1996 | Hartstein et al. | 257/314 |
| 5,714,766 | * 2/1998 | Chen et al. | 257/20 |
| 5,852,306 | * 12/1998 | Forbes | 257/315 |
| 5,949,102 | 9/1999 | Saida et al. | 257/315 |
| 6,060,743 | * 5/2000 | Sugiyama et al. | 257/315 |
| 6,069,380 | * 5/2000 | Chou et al. | 257/315 |

FOREIGN PATENT DOCUMENTS 7-302848    11/1995    (JP) .

OTHER PUBLICATIONS

Sandip Tiwari et al., "A silicone nanocrystals based memory", Appl. Phys Lett. 68(10), Mar. 4, 1996, pp. 1377–1379.

Hussein I. Hanafi et al., "Fast and Long Retention–Time Nano–Crystal Memory", IEEE Transactions on Electron Devices, vol. 43., No. 9, Sep. 1996, pp. 15553–1558.

* cited by examiner

Primary Examiner—Mark V. Prenty
(74) Attorney, Agent, or Firm—Nixon & Vanderhye P.C.

(57) ABSTRACT

There is provided is a semiconductor storage device that can reduce a dispersion in characteristics such as a threshold voltage and a writing performance and has a low consumption power and a non-volatility. There are included a source region 9 and a drain region 10 formed on a silicon substrate 1, a channel region 3a located between the source and drain regions 9 and 10, a gate electrode 8 that is formed above the channel region 3a and controls a channel current flowing through the channel region 3a, and a control gate insulating film 7, a floating gate 6 and a tunnel insulating film 4 that are arranged in order from the gate electrode 8 side between the channel region 3a and the gate electrode 8. The floating gate 6 is comprised of a plurality of crystal grains 6a linearly discretely arranged substantially parallel to the surface of the channel region 3a.

8 Claims, 5 Drawing Sheets

SEMICONDUCTOR STORAGE DEVICE CAPABLE OF IMPROVING CONTROLLABILITY OF DENSITY AND SIZE OF FLOATING GATE

BACKGROUND OF THE INVENTION

The present invention relates to a semiconductor storage device that is electrically erasable and programmable and has non-volatility.

For achieving low power consumption and compacting of electronic equipment, there is needed a semiconductor storage device (EEPROM) that has a high degree of integration and a low power consumption and is electrically erasable and programmable. The semiconductor storage device having the non-volatility has a floating gate between its channel region and gate electrode, and this floating gate is operated as a carrier confining region, the device generally having the following problems.

(i) Since the number of injection and removal of electric charges in the floating gate are limited due to the problem of a reduction in reliability resulting from a hot carrier, there is a limitation in the number of times of write and erase operations.

(ii) A relatively thick insulating film is needed for maintaining the non-volatility. In order to inject an electron or a positive hole into the floating gate by the FOWLER-NORDHEIM tunnel effect through this thick insulating film, a high voltage of not lower than 10 V is required in the present situation. As a result, a hot carrier is generated, and this causes a deterioration of the insulating film by the influence of the formation of a trap and a reaction in the interface due to the hot carrier and alleviation of the hot carrier.

(iii) Since the write and erase operations are executed by a very small current flowing by charging and discharging of the floating gate, the time of charging and discharging is long (on the millisecond order).

Accordingly, a semiconductor storage device that resolves the above problems (i) through (iii) is proposed (Japanese Patent Laid-Open Publication No. HEI 7-302848). In this semiconductor storage device, as shown in FIG. 5, a source region 108 and a drain region 110 are formed at a specified interval on a semiconductor substrate 120, and a floating gate 104 is formed in a region opposite to a channel region 106 between the source and drain regions 108 and 110 via an insulating layer 112 on the semiconductor substrate 120. Then, the floating gate 104 is covered with an insulating layer 102, and a control gate 100 is formed on the insulating layer 102. As shown in FIG. 6, the floating gate 104 is provided in the form of a cluster or an island 122 constructed of a semiconductor material having a diameter of 1 nm to 20 nm. Then, the insulating layer 112 located between the channel region 106 and the floating gate 104 is made as thin as possible so as to allow an electron to directly pass through the layer 112 by the tunnel effect, and the energy level of the floating gate 104 is made lower than that of the channel region 106, thereby preventing the trapped electron from easily escaping.

The following two reference documents describe the fabricating methods of the above floating gate.

(1) A silicon nanocrystals based memory, Sandip Tiwari et al., Appl. Phys. Lett. 68 (10), p1377 (1996)

FIG. 7 shows a schematic diagram of a cross-section of a semiconductor storage device having a floating gate described in the above literature, where a tunnel insulating film 202 having a thickness of 1.1 nm to 1.8 nm is formed on a semiconductor substrate 201 on which a source region 206 and a drain region 207 are formed, and nano-crystals 203 having a diameter of 5 nm are formed at intervals of 5 nm on the tunnel insulating film 202 by a CVD (Chemical Vapor Deposition) system. The density of the nanocrystal 203 is $1 \times 10^{12}$ cm$^{-2}$. Further, a control gate insulating film 204 is formed on the nanocrystals 203, and $SiO_2$ is deposited to a thickness of 7 nm on the control gate insulating film 204, thereby forming a control gate 205.

(2) Fast and Long Retention-time Nano-Crystal Memory, Hussein I. Hanafi et al., IEEE Trans. Electron Device, Vol. 43, p1553 (1996)

FIGS. 8A through 8C show a fabricating method of a semiconductor storage device having a floating gate described in the above literature, according to which a thermal oxide film 302 is formed to a thickness of 5 nm to 20 nm on a semiconductor substrate 301 (shown in FIG. 8A) and a high dose of ions of silicon Si or germanium Ge is implanted into the thermal oxide film 302 in a supersaturated state (shown in FIG. 8B). The ion implantation in this case is performed under, for example, the conditions of 5 keV and $5 \times 10^{15}$ cm$^{-2}$. Subsequently, a heat treatment is effected for 30 minutes at a temperature of 950° C. in an atmosphere of nitrogen $N_2$, thereby growing nano-crystals 303 of silicon Si or germanium Ge having a diameter of 5 nm in the thermal oxide film 302. Then, a source region 305 and a drain region 306 are formed at a regular interval on the semiconductor substrate 301, and a gate electrode 304 is formed on the thermal oxide film 302 oppositely to a region located between the source region 305 and the drain region 306 (shown in FIG. 8C).

As described in the above literatures (1) and (2), a shift voltage $\Delta V_{th}$ of a threshold voltage $V_{th}$ when one electron is stored in one nano-crystal is expressed by the following equation:

$$\Delta V_{th} = q(n_{well}/\epsilon_{ox})(t_{cnt1} + (\epsilon_{OX}/\epsilon_{si})t_{well}/2) \qquad \text{(equation 1)}$$

where q: electron charge, $n_{well}$: nano-crystal density, $\epsilon_{ox}$: dielectric constant of oxide film, $t_{cnt1}$: film thickness of control gate oxide film, $\epsilon_{si}$: dielectric constant of silicon, and $t_{well}$: nano-crystal size.

As is apparent from the above equation 1, it can be understood that a variation in device characteristics ($\Delta V_{th}$) can be reduced by reducing a variation in nano-crystal density $n_{well}$ and nano-crystal size $t_{well}$. The film thickness of the tunnel insulating film located between the nano-crystal and the channel is a determinant of the direct tunneling of an electron to the nano-crystal (the probability of tunneling is expressed by a function of the film thickness of the tunnel insulating film), and therefore, a variation in the film thickness of the tunnel insulating film influences the variation in write characteristics. As described above, the above nano-crystal density, nano-crystal size and film thickness of the tunnel insulating film located between the nano-crystal and the channel are the principal parameters to be controlled inherent in the memory.

Concerning the Literature (1)

The semiconductor storage device of the literature (1) utilizes the nano-crystals that happen to be present on the surface of the ground $SiO2$ film or the nano-crystals that grow in an island shape around random crystalline nuclei occurring in an early stage of CVD. Therefore, neither the nano-crystal density nor the nano-crystal size is controlled, and this leads to the problem that the characteristics vary. On the other hand, in regard to the film thickness of the tunnel insulating film located between the nano-crystals and the channel, because the semiconductor substrate is thermally oxidized in advance, it can be considered that the film thickness can be controlled by the prior art techniques.

Concerning the Literature (2)

In the semiconductor storage device of the literature (2), ions of silicon Si or germanium Ge are implanted into the thermal oxide film 302 and thereafter subjected to heat treatment for the growth of a nano-crystal in the thermal oxide film 302. However, the implanted ion concentration is distributed in the depthwise direction, for which the ion concentration in the thermal oxide film 302 cannot be uniformed. Therefore, the heat treatment is performed in the state in which the concentration distribution is varied, and therefore, the nano-crystal density in the depthwise direction inside the thermal oxide film 302 also has a distribution. Therefore, it is considered difficult to control the nano-crystal density, the nano-crystal size and the film thickness of the tunnel insulating film located between the nano-crystals and the channel. That is, in regard to the subjects of the nano-crystal density, the nano-crystal size and the film thickness of the tunnel insulating film located between the nano-crystals and the channel, it is difficult to improve the controllability and uniformity of them, and this leads to the problem that the characteristics are varied.

Furthermore, in order to implant ions into the very thin oxide film having the film thickness of 5 nm to 20 nm without making the ions reach the ground semiconductor substrate, it is required to achieve ion implantation with as low energy as possible, the energy being, for example, 5 keV with respect to the oxide film having a thickness of 20 nm. If the film thickness of the oxide film is further reduced, then the energy must be further reduced. With the performance of the ordinary ion implanter, it is difficult to control such a low-energy ion implantation, meaning that this is impractical as a fabricating method.

SUMMARY OF THE INVENTION

Accordingly, an object of the present invention is to provide a semiconductor storage device capable of improving controllability of density and size of a floating gate of crystal grains as well as the film thickness of an insulating film located between its region and a channel region and reducing the variation in characteristics such as a threshold voltage and a writing performance, the device also having a low consumption power and a non-volatility.

In order to achieve the aforementioned object, the present invention provides a semiconductor storage device comprising: a source region and a drain region formed of a semiconductor material; a channel region located between the source region and the drain region; a control gate region that is formed above the channel region and controls a channel current flowing through the channel region; and a first insulating film, a floating gate region and a second insulating film that are arranged in order from the control gate region side between the channel region and the gate region, the floating gate region being comprised of a plurality of granular regions discretely linearly arranged substantially parallel to a surface of the channel region or a linear region continuously formed substantially parallel to the surface of the channel region.

According to the semiconductor storage device of the present invention, the floating gate region is constituted by the plurality of granular regions discretely linearly arranged substantially parallel to the surface of the channel region or the linear region continuously formed substantially parallel to the surface of the channel region, where the granular regions are one-dimensionally arranged or the linear region is one-dimensionally arranged. This arrangement reduces the degree of freedom of variation in comparison with the floating gate region arranged two-dimensionally or three-dimensionally, thereby theoretically improving the controllability of the size, number and position. The reason for the above will be described below.

First, for simplicity of explanation, here is now considered the case where x crystal grains are arranged in a limited square region. Assuming that there are N×N positions where the crystal grains are grown, a probability that the crystal grain will grow in each position is p and a probability that the crystal grain will not grow in the position is q, then a probability of the growth of x crystal grains is given by a binomial distribution (N>x, N and x are integers and q=1−p).

In the above case, the average gain number m to be arranged and dispersion $\sigma^2$ are expressed as:

average gain number $m=N^2p$ and dispersion $\sigma^2=N^2pq=N^2p(1-p)$.

When the crystal grains are grown in a specified row or column of this region (linear growth defined by the linear arrangement of crystal grains), an average gain number m' and a dispersion $\sigma'^2$ become:

average gain number $m'=Np'$ and dispersion $\sigma'^2=Np'q'=Np'(1-p')$.

Assuming now that the average gain number m is m', then $N^2p=Np'$ therefore, $p'=Np$ $\sigma'^2=N^2p(1-Np)$ provided that (1−Np)>0. Then the consequence is:

(two-dimensional dispersion $\sigma^2$)−(linear dispersion $\sigma'^2$)=$N^2p(1-p)-N^2p(1-Np)=N^2p^2(N-1)>0$ meaning that the two-dimensional dispersion has a greater variation (dispersion). In regard to the crystal grain size, if the average value of the crystal grain size of the two-dimensional arrangement and the crystal grain size of the linear arrangement are made equal to each other, then the variation of the two-dimensional arrangement similarly becomes greater.

Therefore, according to this semiconductor storage device, the controllability of the density and size of the floating gate region can be increased. Since no floating gate region is formed in the insulating film, the controllability of the film thickness of the second insulating film located between the floating gate region and the channel region can be improved, so that the variation in device characteristics can be remarkably reduced.

In one embodiment, the floating gate region is comprised of the plurality of granular regions and a size D of the granular regions in the floating gate satisfies the conditions:

$q^2/(4 \pi\epsilon_i D)>kT,$ and $$\epsilon_i=(\epsilon_1+\epsilon_2)/2$$

where q is an electron charge, $\epsilon_1$ is a dielectric constant of the first insulating film, $\epsilon_2$ is a dielectric constant of the second insulating film, k is Boltzmann constant and T is a temperature.

According to the semiconductor storage device of the above embodiment, a self-capacitance C of one granular region in the floating gate region is expressed by $2\pi\epsilon_i D$, and an electrostatic energy when one electron is stored in one granular region becomes $q^2/(2C)$. In this case, to achieve an effect (coulomb blockade) for preventing an electron from entering into one granular region after one electron has been stored in the region for the suppression of the number of electrons to be stored in all the granular regions of the floating gate region to the required number, an increase in the electrostatic energy $q^2/(2C)$ when one electron is stored in one granular region is required to be greater than a thermal fluctuation energy kT. Therefore, by setting the size D of the granular region so as to satisfy the condition of $q^2/(4\pi\epsilon_i D)>kT$, the coulomb blockade can be utilized in each granular region of the floating gate region, so that the number of electrons to be stored can be controlled. This remarkably reduces a current to be used for writing when injecting an electron into the floating gate region, so that a low consumption power can be achieved.

In one embodiment, the floating gate region is made of one metal selected from the group consisting of tungsten, molybdenum, cobalt, nickel, platinum, rhodium, palladium and iridium or a mixture or alloy of at least two metals selected from the group consisting of tungsten, molybdenum, cobalt, nickel, platinum, rhodium, palladium and iridium.

According to the semiconductor storage device of the above embodiment, the granular regions or the linear region constituting the floating gate region is made of a metal material, and therefore, an electron can be confined in the floating gate region interposed between the first and second insulating films.

In one embodiment, the floating gate region is made of one semiconductor material selected from the group consisting of silicon, germanium, a mixture of silicon and germanium, a compound of the groups III and V or a compound of the groups II and VI.

According to the semiconductor storage device of the above embodiment, the granular regions or the linear region constituting the floating gate region is made of a semiconductor material, and therefore, an electron can be confined in the floating gate region interposed between the first and second insulating films.

In one embodiment, the floating gate region is the linear region, and the floating gate region is comprised of a polycrystal semiconductor.

According to the semiconductor storage device of the above embodiment, the linear region constituting the floating gate region is comprised of a polycrystal semiconductor, and therefore, an electron can be confined in the crystal grain in the linear region interposed between the first and second insulating films.

In one embodiment, a crystal grain size A in a lengthwise direction and a cross-sectional area S of the linear region of the floating gate region satisfy the conditions:

$$q^2/(2C)>kT,$$

$$C=2\pi\epsilon_i A/\log[\{(A/2+(A^2/4+s^2/4)^{1/2})\}/(S/2)]$$

and $$\epsilon_i=(\epsilon_1+\epsilon_2)/2$$

where q is the electron charge, $\epsilon_1$ is the dielectric constant of the first insulating film, $\epsilon_2$ is the dielectric constant of the second insulating film, k is Boltzmann constant and T is a temperature.

According to the semiconductor storage device of the above embodiment, the self-capacitance C of one crystal grain in the linear region of the floating gate region is expressed by:

$$C=2\pi\epsilon_i A/\log[\{(A/2+(A^2/4+s^2/4)^{1/2})\}/(S/2)]$$

where the electrostatic energy when one electron is stored in one crystal grain becomes $q^2/(2C)$. In order to achieve the effect (coulomb blockade) for preventing an electron from entering into one crystal grain after one electron has been stored in the grain for the suppression of the number of electrons to be stored in the linear region of the floating gate region to the required number, an increase in the electrostatic energy $q^2/(2C)$ when one electron is stored in one crystal grain is required to be greater than the thermal fluctuation energy kT. Therefore, by setting the size A in the lengthwise direction and the cross-sectional area S of the crystal grain of the linear region of the floating gate region so as to satisfy the condition of $q^2/(2C)>kT$, the coulomb blockade can be utilized in each crystal grain in the linear region of the floating gate region, so that the number of electrons to be stored can be controlled. This remarkably reduces a current to be used for writing when injecting an electron into the floating gate region, so that a low consumption power can be achieved.

In one embodiment, the number N of crystal grains in the linear region on the channel region and the size A of the crystal grain in the lengthwise direction of the linear region satisfy the conditions:

$$q(N/LW\epsilon_i)(t_1+(\epsilon_i/\epsilon_1)A/2)>kT/q$$

and $$\epsilon_i=(\epsilon_1+\epsilon_2)/2$$

where q is an electron charge, L is a length of the channel region, W is a width of the channel region, $\epsilon_1$ is a dielectric constant of the first insulating film, $\epsilon_2$ is a dielectric constant of the second insulating film and $t_1$ is a film thickness of the first insulating film.

According to the semiconductor storage device of the above embodiment, in order to externally sense the shift voltage $\Delta$Vth representing a change in the threshold voltage Vth due to the electron stored in the floating gate region, the shift voltage $\Delta$Vth is required to be greater than the thermal fluctuation energy. Therefore, by setting the number N of the crystal grains in the floating gate region existing above the channel region so as to satisfy the condition:

$$\Delta Vth=q(N/LW\epsilon_1)(t_i+(\epsilon_i/\epsilon_1)A/2)>kT/q,$$

the shift voltage $\Delta$Vth of the threshold voltage Vth sufficient for the operation as a memory can be obtained.

The present invention also provides a semiconductor storage device comprised of a MOS transistor having a floating gate region located between a control gate region and a channel region, the floating gate region being comprised of a plurality of nano-crystals linearly arranged substantially parallel to a surface of a channel region.

According to the semiconductor storage device of the above invention, the floating gate region is constituted by the plurality of nano-crystals linearly arranged substantially parallel to the surface of the channel region, where the nano-crystals are one-dimensionally arranged. This arrangement reduces the degree of freedom of variation in comparison with the floating gate region arranged two-dimensionally or three-dimensionally and improves the controllability of the size, number and position. Therefore, the present semiconductor storage device can improve the controllability of the density and size of the floating gate region, so that the variation in device characteristics can be remarkably reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
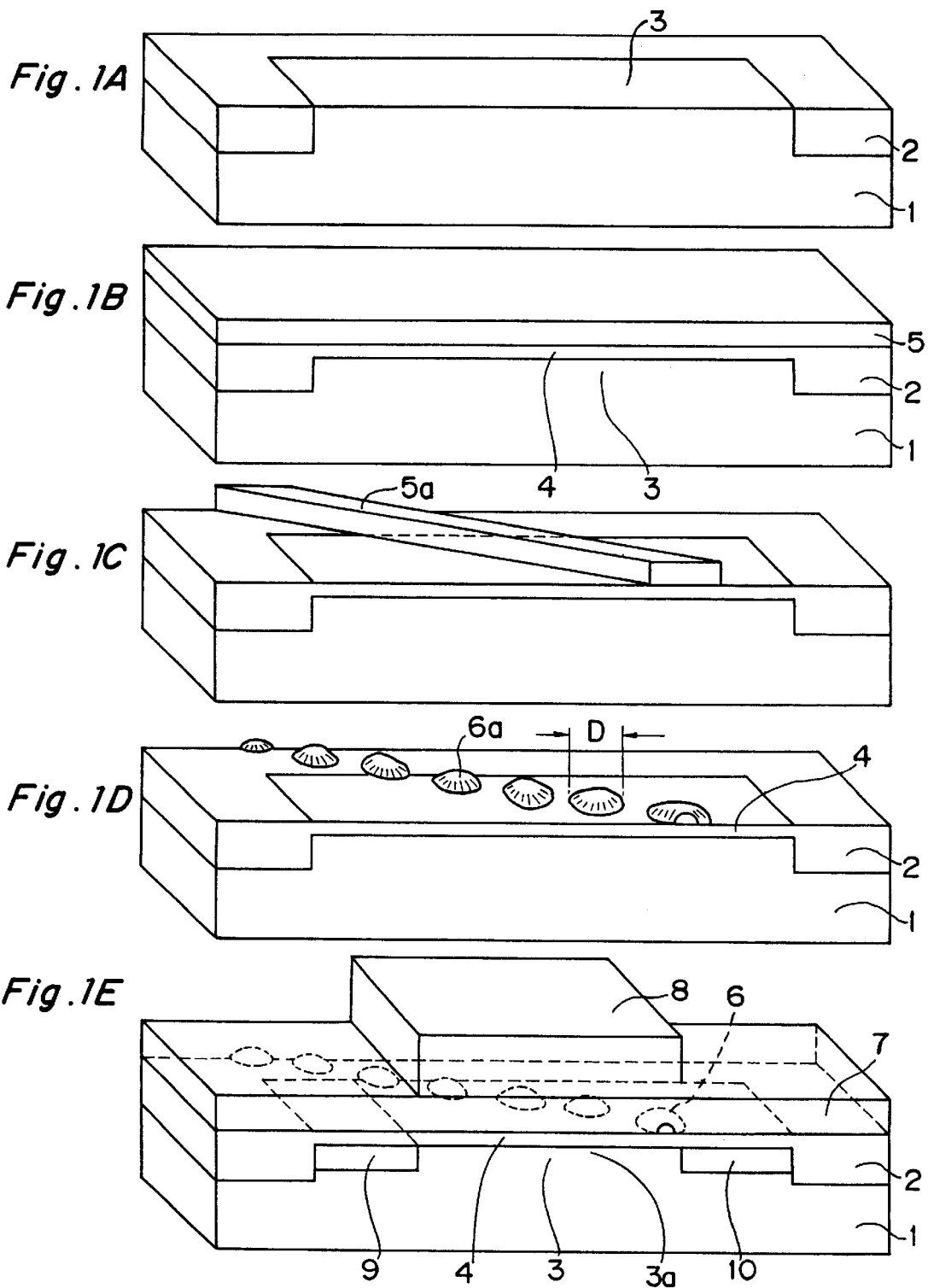
FIGS. 1A, 1B, 1C, 1D and 1E are views showing a fabricating method of a semiconductor storage device according to a first embodiment of the present invention.

The semiconductor storage device of the present invention will be described in detail below based on the embodiments thereof shown in the drawings.

First Embodiment

FIGS. 1A through 1E are views showing a fabricating method of a semiconductor storage device according to a first embodiment of the present invention. In this first embodiment, a semiconductor storage device employing a granular floating gate will be described.

First, as shown in FIG. 1A, an element isolation insulating film 2 is formed on a monocrystal silicon substrate 1 by a general element isolating technique, forming an active region 3 having a width of 0.2 μm.

Next, as shown in FIG. 1B, the surface of the silicon substrate 1 is oxidized by RTO (Rapid Thermal Oxidation) under the following conditions, thereby forming a tunnel oxide film 4 that serves as a second insulating film having a thickness of 2 nm on the surface of the silicon substrate 1.

mixed gas of $N_2O$ and $O_2$: $N_2O/(N_2O+O_2)=65\%$
temperature: 1050° C. Then, a polycrystal silicon thin film 5 having a thickness of 10 nm is formed on the tunnel oxide film 4 by a CVD (Chemical Vapor Deposition) equipment.

Next, as shown in FIG. 1C, the polycrystal silicon thin film 5 is patterned by EB (Electron Beam) lithography and RIE (Reactive Ion Etching), thereby forming a thin line 5a having a width of 25 nm.

Next, as shown in FIG. 1D, the thin line 5a made of polycrystal silicon is oxidized in a water vapor atmosphere. If the oxidation is effected so that the film thickness of the oxide film becomes about 14 nm, the thin line 5a comes to have a form in which crystal grains 6a that serve as a granular region having a height of 3 nm and a size of about 11 nm are linearly arranged because the oxidation at the grain boundary in the water vapor atmosphere is twice as fast as a speed in dry oxygen. That is, the thin line 5a has a form in which rectangular parallelepiped crystal grains having a height of 10 nm, a length of 15 nm and a width of 25 nm are continuously arranged in a line. Each crystal grain comes to have a length of 9 nm (=15−3×2) by being consumed in the lengthwise direction by 3 nm due to the oxidation from the grain boundary side, and comes to have a height of 3 nm (=10−7) and a width of 11 nm (=25−7×2) by being consumed by 7 nm due to the oxidation in the other directions.

Next, as shown in FIG. 1E, $SiO_2$ is deposited to a thickness of 10 nm on the tunnel oxide film 4 and the crystal grains 6a by the CVD equipment, thereby forming a control gate insulating film 7 that serves as a first insulating film. Then, a polycrystal silicon region is formed on the control gate insulating film 7 and doped with phosphor at a high concentration for the reduction in resistance, and a gate electrode 8 is formed as a control gate region. The gate electrode 8 has a gate length of 0.2 μm.

Subsequently, source and drain regions 9 and 10 are formed on the active region 3 by the normal LSI (Large Scale Integrated Circuit) fabricating process, and an interlayer insulating film, a contact hole, interconnections and a passivation film (these are not shown) are successively formed. The gate electrode 8 controls a channel current flowing through the channel region 3a located between the source and drain regions 9 and 10.

As a material for the floating gate 6, a material having a conductivity such as a metal may be employed, and it is acceptable to employ a metal of, for example, tungsten, molybdenum, cobalt, nickel, platinum, rhodium, palladium and iridium or a mixture or alloy of these materials. In this case, the crystal grains 6a that serve as the granular regions constituting the floating gate 6 are made of metal, and therefore, an electron can be confined in the floating gate 6 interposed between the tunnel insulating film 4 and the control gate insulating film 7.

As another material for the floating gate 6, it is acceptable to employ a semiconductor material of germanium, a mixture of silicon and germanium, a compound of the groups III and V (a combination of Al, Ga or In belonging to the group III and P, As or Sb belonging to the group V), a compound of the groups II and VI (a combination of Zn, Cd or Hg belonging to the group II and O, S, Se or Te belonging to the group VI) or the like.

As described above, in the above semiconductor storage device, the controllability of the density and size of the crystal grains 6a of the floating gate 6 that serves as the carrier confining region can be improved. Since no floating gate is formed in the insulating film, the film thickness of the tunnel insulating film 4 between the crystal grains 6a and the channel region can easily be controlled, so that the variation in characteristics such as the threshold voltage and the writing performance can be reduced. There can be provided a semiconductor storage device capable of storing therein information at room temperature without necessitating cooling to the extremely low temperature. Furthermore, by employing this semiconductor storage device, an information storage device (memory) which has a reduced amount of elements and a small area, permits fast rewriting and has non-volatility can be realized.

By setting the size D of the granular region of the floating gate 6 so as to satisfy the conditions:

$$q^2/(4\pi\epsilon_r D) > kT,$$

and $$\epsilon_r = (\epsilon_1 + \epsilon_2)/2$$

where q: electron charge, $\epsilon_1$: dielectric constant of control gate insulating film 7 (first insulating film), $\epsilon_2$: dielectric constant of tunnel insulating film 4 (second insulating film), k: Boltzmann constant and T: temperature, the coulomb blockade can be utilized in the crystal grains 6a of the floating gate 6, so that the number of electrons to be stored can be controlled. This can remarkably reduce the current to be used for writing to inject an electron into the floating gate 6, so that a low consumption power can be achieved.

The crystal grains 6a that serve as the granular region constituting the floating gate 6 are made of a semiconductor material, and therefore, electrons can be confined in the floating gate 6 interposed between the tunnel insulating film 4 and the control gate insulating film 7.

Second Embodiment

FIGS. 2A through 2E are views showing fabricating processes of a semiconductor storage device according to a second embodiment of the present invention. In this second embodiment, a semiconductor storage device uses a linear floating gate.

The above semiconductor storage device can be formed basically through the same processes as those of the first embodiment. However, in order to make the floating gate of a continuous thin line, polycrystal silicon is once processed into a thin line and thereafter oxidized in dry oxygen.

Figure 2:
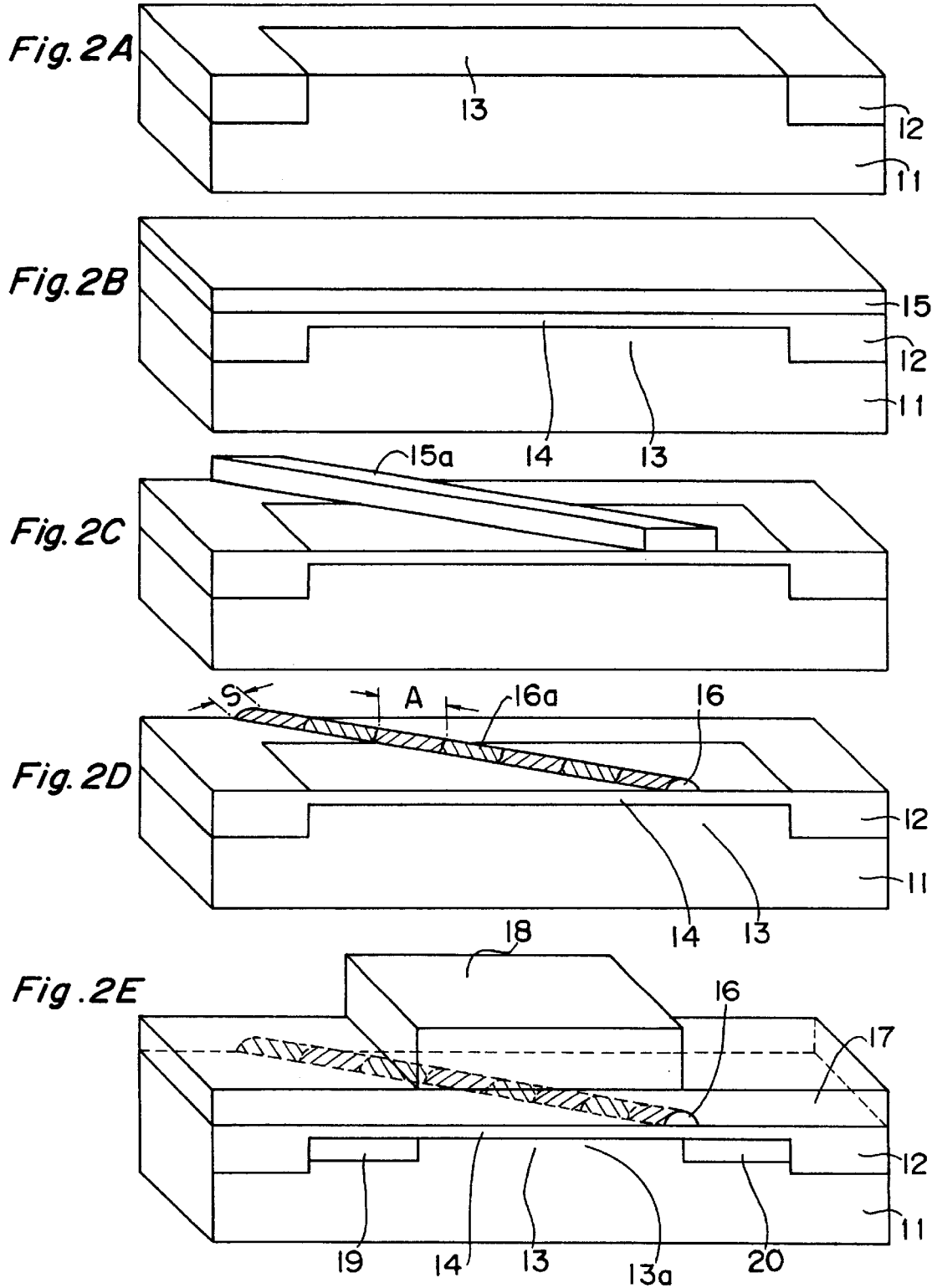
FIGS. 2A, 2B, 2C, 2D and 2E are views showing a fabricating method of a semiconductor storage device according to a second embodiment of the present invention.

That is, as shown in FIG. 2A, an element isolation insulating film 12 is formed on a monocrystal silicon substrate 11 by the general element isolating technique, thereby forming an active region 3 having a width of 0.2 µm.

Next, as shown in FIG. 2B, the surface of the silicon substrate 11 is oxidized by RTO (Rapid Thermal Oxidation) under the following conditions, thereby forming a tunnel oxide film 14 that serves as a second insulating film having a thickness of 2 nm on the surface of the silicon substrate 11.

mixed gas of $N_2O$ and $O_2$: $N_2O/(N_2O+O_2)=65\%$ temperature: 1050° C.

Then, a polycrystal silicon thin film 15 having a thickness of 10 nm is formed on the tunnel oxide film 14 by a CVD equipment.

Next, as shown in FIG. 2C, the polycrystal silicon thin film 15 is patterned by EB (Electron Beam) lithography and RIE (Reactive Ion Etching), thereby forming a thin line 15a having a width of 25 nm.

Next, as shown in FIG. 2D, the thin line 15a made of polycrystal silicon is oxidized in dry oxygen. In the oxygen, the accelerated oxidation as observed at the grain boundary of the first embodiment is suppressed, and therefore, the thin line 15a changes into a floating gate 16 that is the linear region having a thickness of 3 nm and a width of 11 nm.

Next, as shown in FIG. 2E, $SiO_2$ is deposited to a thickness of 10 nm on the tunnel oxide film 14 and the floating gate 16 by the CVD equipment, thereby forming a control gate insulating film 17 that serves as a first insulating film. Then, a polycrystal silicon region is formed on the control gate insulating film 17 and doped with phosphor at a high concentration for the reduction in resistance, and a gate electrode 18 is formed.

Subsequently, source and drain regions 19 and 20 are formed on the active region 13 by the normal LSI (Large Scale Integrated Circuit) fabricating process, and an interlayer insulating film, a contact hole, interconnections and a passivation film (these are not shown) are successively formed.

As a material for the above floating gate, a material having a conductivity such as a metal may be employed, and it is acceptable to employ a metal of, for example, tungsten, molybdenum, cobalt, nickel, platinum, rhodium, palladium and iridium or a mixture or alloy of these materials. In this case, the crystal grains 16a constituting the floating gate 16 are made of metal, and therefore, electrons can be confined in the floating gate 16 interposed between the tunnel insulating film 14 and the control gate insulating film 17.

As another material for the above floating gate, it is acceptable to employ a semiconductor material of germanium, a mixture of silicon and germanium, a compound of the groups III and V, a compound of the groups II and VI or the like.

In regard to the forming methods of the crystal grain 6a that serves as the floating gate 6 of the first embodiment and the linear region of the floating gate 16 of the second embodiment, the present invention is not limited to those of the first and second embodiments, and any appropriate fabricating method may be used depending on the material of the floating gate.

As described above, in the above semiconductor storage device, the controllability of the density and size of the crystal grains 16a of the floating gate 16 that serves as the carrier confining region can be improved. Since no floating gate is formed in the insulating film, the film thickness of the tunnel insulating film 14 between the crystal grains 16a and the channel region 13a can easily be controlled, so that the dispersion in characteristics such as the threshold voltage and the writing performance can be reduced. There can be provided a semiconductor storage device capable of storing therein information at room temperature without necessitating cooling to the extremely low temperature. Furthermore, by employing this semiconductor storage device, an information storage device (memory) which has a reduced amount of elements and a small area can be constructed, permits fast rewriting and has non-volatility can be realized.

Since the floating gate 16 is made of polycrystal semiconductor, electrons can be confined in the floating gate 16 interposed between the tunnel insulating film 14 and the control gate insulating film 17.

By setting the size A in the lengthwise direction and the cross-sectional area S of the crystal grain 16a in the linear region of the floating gate 16 so as to satisfy the conditions:

$$q^2/(2C) > kT,$$

$$C = 2\pi\epsilon_r A/\log\left[\{(A/2+(A^2/4+s^2/4)^{1/2})\}/(S/2)\right]$$

and $$\epsilon_i=(\epsilon_1+\epsilon_2)/2$$

where q: electron charge, $\epsilon_1$: dielectric constant of control gate insulating film 17 (first insulating film), $\epsilon_2$: dielectric constant of tunnel insulating film 14 (second insulating film), k: Boltzmann constant and T: temperature, the coulomb blockade can be utilized in each crystal grain 16a in the linear region of the floating gate 16, so that the number of electrons to be stored can be controlled. This remarkably reduces the current to be used for writing to inject an electron into the floating gate 16, so that a low consumption power can be achieved.

By setting the number N of the crystal grains 16a of the floating gate 16 above the channel region and the size A of each crystal grain 16a so as to satisfy the conditions:

$$q(N/LW\epsilon_i)(t_1+(\epsilon_1/\epsilon_1)A/2)>kT/q$$

and $$\epsilon_i=(\epsilon_1+\epsilon_2)/2$$

where q: electron charge,

L: length of channel region,

W: width of channel region, and $t_1$: film thickness of tunnel insulating film 14, the shift voltage ΔVth of the threshold voltage Vth sufficient for operation as a memory can be obtained.

Although the first and second embodiments employ the monocrystal silicon substrates 1 and 11, an SOI (Semiconductor on Insulator) substrate as provided by SIMOX (isolation by Implanted Oxygen) may be employed.

Figure 3:
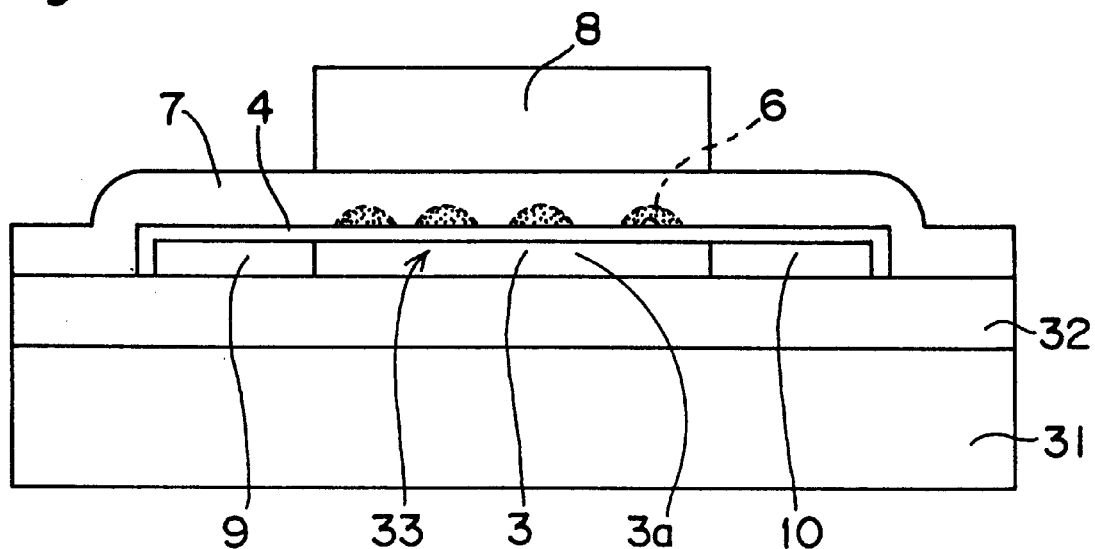
FIG. 3 is a sectional view of the semiconductor storage device of the first embodiment, wherein nano-crystals are formed on an SOI substrate.

For example, as shown in FIG. 3, a tunnel insulating film 4 is formed on an SOI substrate constructed of a semiconductor substrate 31, a buried oxidation layer 32 and a semiconductor layer 33, and a floating gate 6 constructed of a plurality of granular regions is formed on the tunnel insulating film 4. Then, a control gate insulating film 7 is formed on the floating gate 6 and the tunnel insulating film 4, and a gate electrode 8 is formed in a region opposite to a channel region 3a located between a source region 9 and a drain region 10 formed in the semiconductor layer 33 on the control gate insulating film 7.

Figure 4:
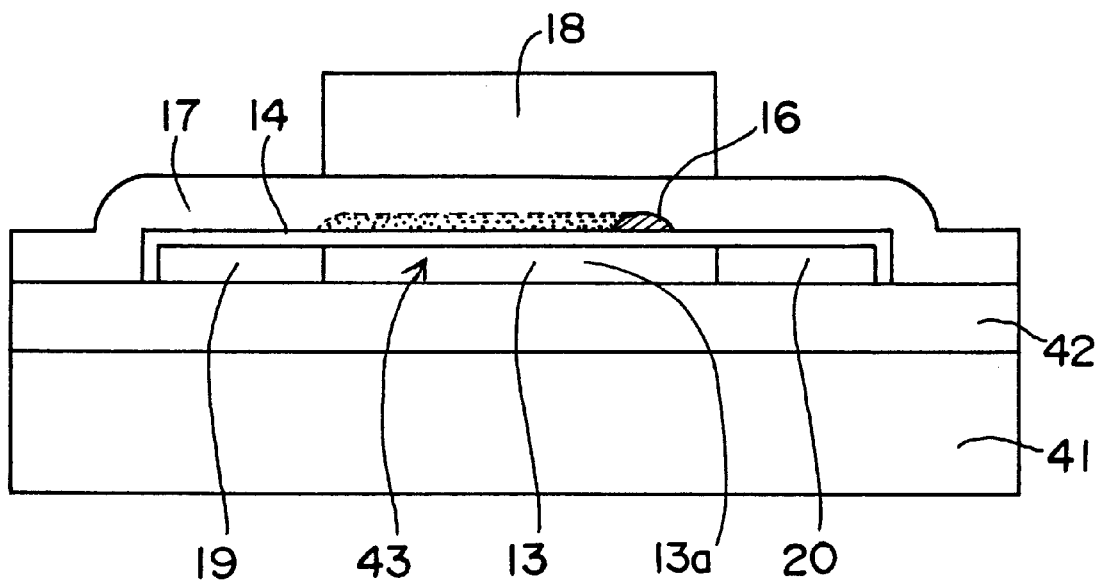
FIG. 4 is a sectional view of the semiconductor storage device of the second embodiment, wherein nano-crystals are formed on an SOI substrate.
Figure 5:
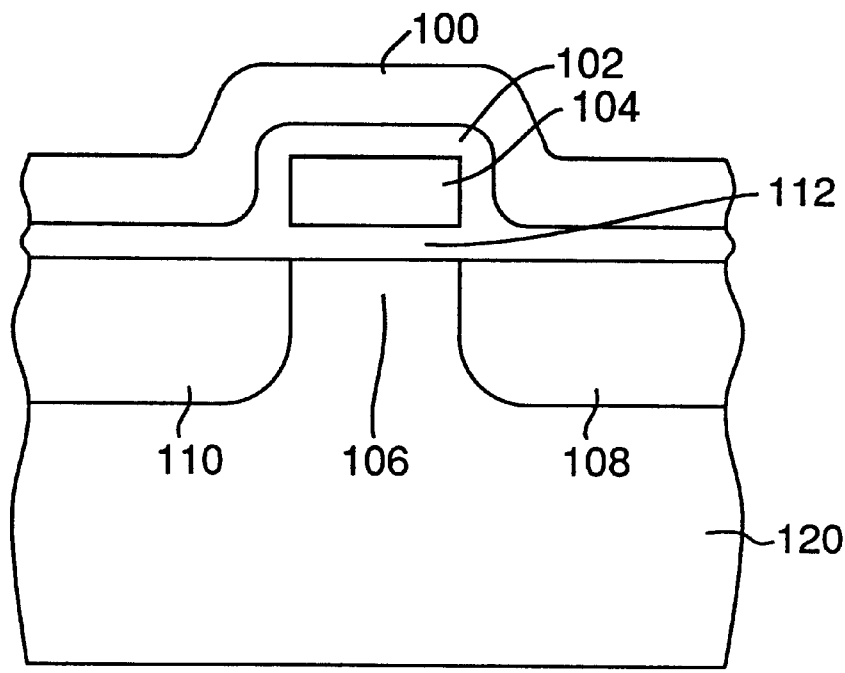
FIG. 5 is a sectional view of a prior art semiconductor storage device.
Figure 6:
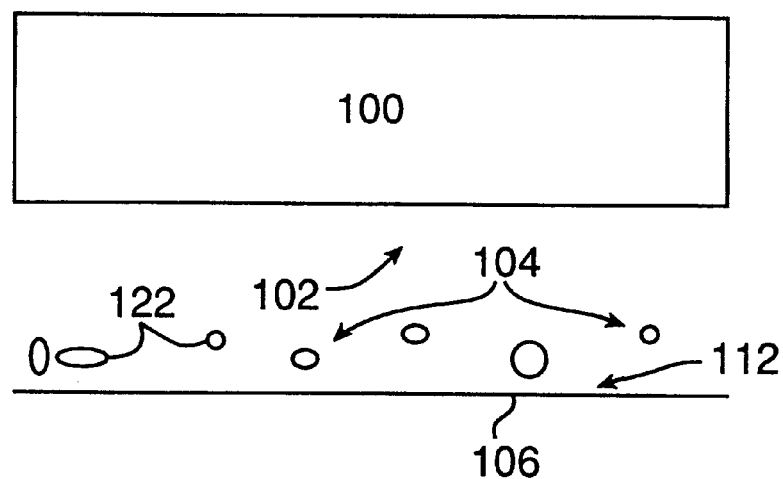
FIG. 6 is an enlarged view showing a floating gate of the above semiconductor storage device.
Figure 7:
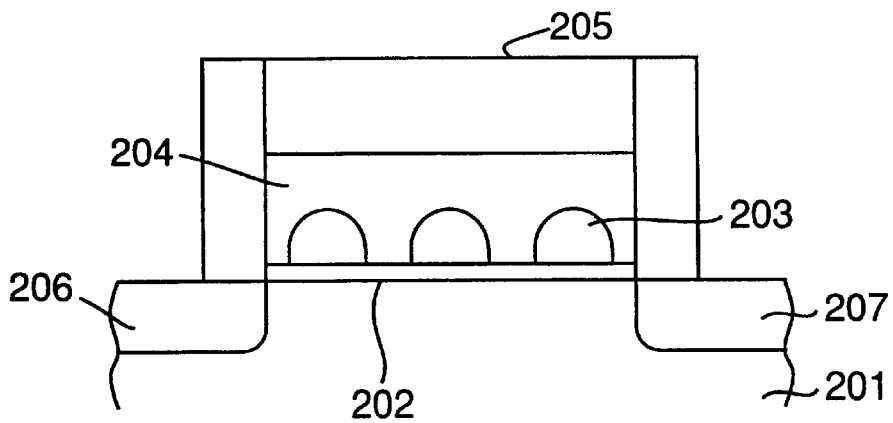
FIG. 7 is a schematic view of a cross-section of a prior art semiconductor storage device having nano-crystals on a tunnel insulating film.
Figure 8A:
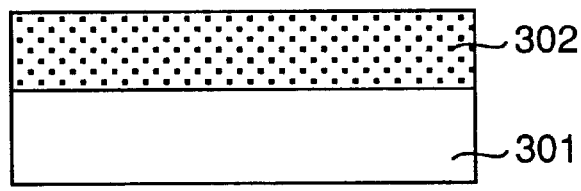
FIGS. 8A, 8B and 8C are views showing the processes of a fabricating method of a prior art semiconductor storage device having nano-crystals in its thermal oxide film.
Figure 8B:
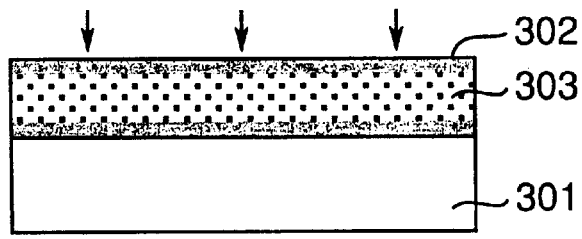
Figure 8C:
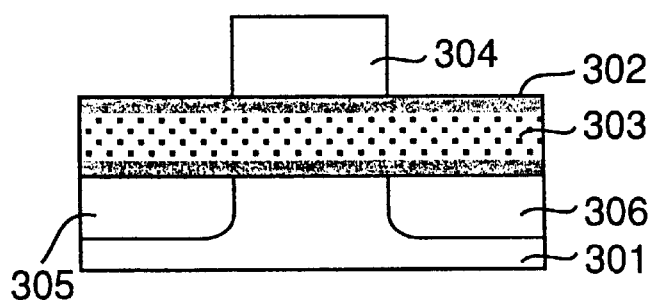

As shown in FIG. 4, a tunnel insulating film 14 is formed on an SOI substrate constructed of a semiconductor substrate 41, a buried oxidation layer 42 and a semiconductor layer 43, and a linear floating gate 16 is formed on the tunnel insulating film 14. Then, a control gate insulating film 17 is formed on the floating gate 16 and the tunnel insulating film 14, and a gate electrode 18 is formed in a region opposite to a channel region 13a located between a source region 19 and a drain region 20 formed in the semiconductor layer 43 on the control gate insulating film 17.

According to the semiconductor storage device of the present invention, a floating gate is constructed of linearly discretely arranged crystal grains or linearly continuously arranged crystal grains. Therefore, the controllability of the density (number) and size of the crystal grains of the floating gate can be improved without dispersion in comparison with a floating gate region arranged two-dimensionally or three-dimensionally. Furthermore, since no floating gate is formed in an insulating film, the film thickness of an insulating film located between the floating gate region and a channel region can easily be controlled, so that the variation in characteristics such as a threshold voltage and a writing performance can be reduced. There can be provided a semiconductor storage device capable of storing therein information at room temperature without necessitating cooling to an extremely low temperature. Furthermore, by employing this semiconductor storage device, an information storage device (memory) which has a reduced amount of elements and a small area, permits fast rewriting and has non-volatility can be provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:

a source region and a drain region formed of semiconductor material; a channel region located between the source region and the drain region; a control gate region that is formed above the channel region and controls a channel current flowing through the channel region; and a first insulating film, a floating gate region and a second insulating film that are arranged in order from the control gate region side between the channel region and the control gate region, wherein the floating gate region is comprised of a plurality of granular regions discretely linearly arranged in an elongated manner substantially parallel to a surface of the channel region; and the floating gate region comprises the plurality of granular regions and a size D of the granular regions in the floating gate region satisfies the conditions:

$$q^2/(4\pi\epsilon_i D)>kT,$$

and $$\epsilon_i=(\epsilon_1+\epsilon_2)/2$$

where q is an electron charge, $\epsilon_1$ is a dielectric constant of the first insulating film, $\epsilon_2$ is a dielectric constant of the second insulating film, k is Boltzmann constant and T is a temperature of the semiconductor storage device.

2. A semiconductor storage device comprising:

a source region and a drain region formed of semiconductor material;

a channel region located between the source region and the drain region;

a control gate region formed above the channel region for controlling a channel current flowing through the channel region;

a first insulating film, a floating gate region and a second insulating film between the channel region and the control gate region;

wherein the floating gate region comprises a linear region which is continuously formed substantially parallel to the surface of the channel region;

wherein the floating gate region is the linear region, and the floating gate region is comprised of a polycrystal semiconductor;

wherein a crystal grain size A in a lengthwise direction and a cross-sectional area S of the linear region of the floating gate region satisfy the conditions:

$$q^2/(2C) > kT,$$

$$C = 2\pi\epsilon_i A/\log(\{(A/2 + (A^2/4 + S^2/4)^{+e,fra\ 1/2} + ee\,)\}/(S/2))$$

and $$\epsilon_i = (\epsilon_1 + \epsilon_2)/2$$

where q is the electron charge, $\epsilon_1$ is a dielectric constant of the first insulating film, $\epsilon_2$ is a dielectric constant of the second insulating film, k is Boltzmann constant and T is a temperature of the semiconductor device.

3. A semiconductor storage device comprising:

a source region and a drain region formed of semiconductor material;

a channel region located between the source region and the drain region;

a control gate region formed above the channel region for controlling a channel current flowing through the channel region;

a first insulating film, a floating gate region and a second insulating film between the channel region and the control gate region;

wherein the floating gate region comprises a linear region which is continuously formed substantially parallel to the surface of the channel region;

wherein the floating gate region is the linear region, and the floating gate region is comprised of a polycrystal semiconductor;

wherein a number N of crystal grains in the linear region and a size A of the crystal grain in the lengthwise direction of the linear region satisfy the conditions:

$$q(n/LW\epsilon_i)(t_1 + (\epsilon_i/\epsilon_1)A/2) > kT/q$$

and $$\epsilon_i = (\epsilon_1 + \epsilon_2)/2$$

where q is an electron charge, L is a length of the channel region, w is a width of the channel region, $\epsilon_1$ is a dielectric constant of the first insulating film, $\epsilon_2$ is a dielectric constant of the second insulating film, k is Boltzmann constant, T is a temperature of the semiconductor device, and $t_1$ is a film thickness of the first insulating film.

4. A semiconductor storage device as claimed in claim 1, wherein the floating gate region is made of one metal selected from the group consisting of tungsten, molybdenum, cobalt, nickel, platinum, rhodium, palladium and iridium or a mixture or alloy of at least two metals selected from the group consisting of tungsten, molybdenum, cobalt, nickel, platinum, rhodium, palladium and iridium.

5. A semiconductor storage device as claimed in claim 1, wherein the floating gate region is made of one semiconductor material selected from the group consisting of silicon, germanium, a mixture of silicon and germanium, a compound of the groups III and V or a compound of the groups II and VI.

6. The semiconductor storage device of claim 1, wherein the semiconductor storage device comprises a MOS transistor having the floating gate region located between the control gate region and the channel region, wherein the floating gate region comprises a plurality of nano-crystals which are discretely linearly arranged in a one dimensional manner substantially parallel to a surface of the channel region.

7. The semiconductor storage device of claim 2, wherein the semiconductor storage device comprises a MOS transistor including the floating gate region located at least partially between the control gate region and the channel region, and wherein the floating gate region comprises a plurality of nano-crystals which are continuously linearly arranged in a one dimensional manner substantially parallel to a surface of a channel region.

8. The semiconductor storage device of claim 3, wherein the semiconductor storage device comprises a MOS transistor including the floating gate region located at least partially between the control gate region and the channel region, and wherein the floating gate region comprises a plurality of nano-crystals which are continuously linearly arranged in a one dimensional manner substantially parallel to a surface of a channel region.

* * * * *